(12) United States Patent
Kobayashi et al.

(10) Patent No.: US 10,959,328 B2
(45) Date of Patent: Mar. 23, 2021

(54) WIRING SUBSTRATE, STACKED WIRING SUBSTRATE, AND MANUFACTURING METHOD OF WIRING SUBSTRATE

(71) Applicant: SHINKO ELECTRIC INDUSTRIES CO., LTD., Nagano (JP)

(72) Inventors: Naoki Kobayashi, Nagano (JP); Kei Murayama, Nagano (JP); Mitsuhiro Aizawa, Nagano (JP); Shota Miki, Nagano (JP)

(73) Assignee: SHINKO ELECTRIC INDUSTRIES CO., LTD.

( * ) Notice: Subject to any disclaimer, the term of this patent is extended or adjusted under 35 U.S.C. 154(b) by 0 days.

(21) Appl. No.: 16/915,107

(22) Filed: Jun. 29, 2020

(65) Prior Publication Data
US 2021/0007220 A1 Jan. 7, 2021

(30) Foreign Application Priority Data
Jul. 1, 2019 (JP) .............................. JP2019-123233

(51) Int. Cl.
*H05K 1/02* (2006.01)
*H05K 3/34* (2006.01)
(Continued)

(52) U.S. Cl.
CPC ..... *H05K 1/0298* (2013.01); *H01L 23/49822* (2013.01); *H01L 23/49838* (2013.01);
(Continued)

(58) Field of Classification Search
CPC ... H01L 24/12; H01L 23/49816; H01L 24/11; H01L 24/81; H01L 24/16; H01L 27/14683; H01L 27/14618; H01L 2924/01029; H01L 2924/3511; H01L 2924/01079; H01L 2224/13099; H01L 2224/81194; H01L 2224/81208; H01L 2924/01013; H01L 2224/81815; H01L 2224/13147;
(Continued)

(56) References Cited

U.S. PATENT DOCUMENTS 5,641,946 A * 6/1997 Shim .................... H05K 3/3457
174/261
9,099,364 B1 * 8/2015 Hsu .......................... H01L 24/03
(Continued)

FOREIGN PATENT DOCUMENTS

| JP | 2007-305814 | 11/2007 |
| JP | 2014-110390 | 6/2014 |
| WO | 2018/173764 A1 | 9/2018 |

*Primary Examiner* — Steven T Sawyer
(74) *Attorney, Agent, or Firm* — Rankin, Hill & Clark LLP

(57) ABSTRACT

A wiring substrate includes: a wiring structure that includes a wiring layer and an insulating layer laminated; a plurality of first posts that are formed along a periphery of a predetermined area on a surface of the wiring structure, and that protrude out from the surface of the wiring structure; and a second post that is connected to the wiring layer at a position surrounded by the first posts, and that protrudes out from the surface of the wiring structure. The first posts are formed such that a post arranged at a central portion of a side constituting the periphery of the predetermined area is lower in height from the surface of the wiring structure than posts arranged at both ends of the side.

8 Claims, 10 Drawing Sheets

(51) Int. Cl.
*H05K 3/40* (2006.01)
*H05K 3/46* (2006.01)
*H01L 23/498* (2006.01)
*H01L 23/00* (2006.01)

(52) U.S. Cl.
CPC ............ *H01L 24/29* (2013.01); *H05K 3/341* (2013.01); *H05K 3/4007* (2013.01); *H05K 3/4605* (2013.01); *H05K 2201/09781* (2013.01); *H05K 2203/049* (2013.01); *H05K 2203/0574* (2013.01)

(58) Field of Classification Search
CPC ... H01L 2224/8121; H01L 2924/01006; H01L 2924/01033; H01L 2924/014; H01L 2224/11334; H01L 2224/1403; H01L 2924/12043; H01L 2224/14132; H01L 2224/14134; H01L 2224/141; H01L 24/29; H01L 23/49838; H01L 23/49822; H05K 3/3436; H05K 2201/094; H05K 2201/09018; H05K 1/0298; H05K 3/4605; H05K 3/341; H05K 3/4007; H05K 2203/0574; H05K 2203/049; H05K 2201/09781; H05K 1/0271; Y02P 70/50

See application file for complete search history.

(56) References Cited

U.S. PATENT DOCUMENTS

| | | | |
|---|---|---|---|
| 2003/0060035 A1* | 3/2003 | Kimura | H01L 24/81 438/626 |
| 2009/0045510 A1* | 2/2009 | Naya | H01L 24/11 257/737 |
| 2011/0233771 A1* | 9/2011 | Kwon | H01L 23/49838 257/737 |
| 2012/0086123 A1* | 4/2012 | Park | H01L 23/3128 257/738 |
| 2013/0344661 A1* | 12/2013 | Lin | H01L 23/3114 438/124 |
| 2016/0005707 A1* | 1/2016 | Kwon | H01L 25/0657 257/737 |

* cited by examiner

WIRING SUBSTRATE, STACKED WIRING SUBSTRATE, AND MANUFACTURING METHOD OF WIRING SUBSTRATE

CROSS-REFERENCE TO RELATED APPLICATION

This application is based upon and claims the benefit of priority of the prior Japanese Patent Application No. 2019-123233, filed on Jul. 1, 2019, the entire contents of which are incorporated herein by reference.

FIELD

The embodiment discussed herein is related to a wiring substrate, a stacked wiring substrate, and a manufacturing method of a wiring substrate.

BACKGROUND

In recent years, to facilitate high integration densities and fine geometries of semiconductor devices, three-dimensional mounting in which multiple wiring substrates are piled in three dimension to be mounted has been studied. In such three-dimensional mounting, for example, a relay board having minute wirings can be joined on a main board. Specifically, between the main board and the relay board, an underfill material, such as a non-conductive film (NCF), is filled, and the relay board is attached to the main board. Moreover, conductive posts are formed on a surface of the main board, and these posts and an electrode pad formed on a surface of the relay board are connected with solder. Thus, the main board and the relay board are electrically connected.

When joining the main board and the relay board, pressure is applied toward a direction in which the both wiring substrates come close to each other in a state in which the underfill material is filled between the wiring substrates. At this time, for example, the underfill material flows over from between the wiring substrates, and forms, for example, a fillet around the relay board. That is, for example, as illustrated in FIG. 11, when a relay board 20 is attached to a main board 10, a fillet 30 is formed around the relay board 20 with the underfill material drained out from between the wiring substrates. FIG. 11 is a plan view of a stacked wiring substrate in which the main board 10 and the relay board 20 are joined, viewed from a direction of the relay board 20
Patent Document 1: WO2018/173764
Patent Document 2: Japanese Laid-open Patent Publication No. 2014-110390
Patent Document 3: Japanese Laid-open Patent Publication No. 2007-305814

However, there is a disadvantage to the stacked wiring substrate described above that a shape of the fillet formed around the relay board is not uniform, and a part mounting area on the main board is limited. Specifically, as illustrated in FIG. 11, the fillet 30 spreads widely at a central portion of each of four sides of the relay board 20, and it is difficult to mount a part near the relay board 20.

Moreover, because the fillet 30 spreads out largely at the central portions while the fillet 30 spreads less at portions of four corners of the relay board 20, it is difficult to mount parts on the main board 10 aligning positions thereof, and flexibility of parts arrangement is reduced.

SUMMARY

According to an aspect of an embodiment, a wiring substrate includes: a wiring structure that includes a wiring layer and an insulating layer laminated; a plurality of first posts that are formed along a periphery of a predetermined area on a surface of the wiring structure, and that protrude out from the surface of the wiring structure; and a second post that is connected to the wiring layer at a position surrounded by the first posts, and that protrudes out from the surface of the wiring structure. The first posts are formed such that a post arranged at a central portion of a side constituting the periphery of the predetermined area is lower in height from the surface of the wiring structure than posts arranged at both ends of the side.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, one embodiment of a wiring substrate, a stacked wiring substrate, and a manufacturing method of a wiring substrate disclosed in the present application will be described in detail with reference to the drawings. Note that this embodiment is not intended to limit the present invention.

Figure 1:
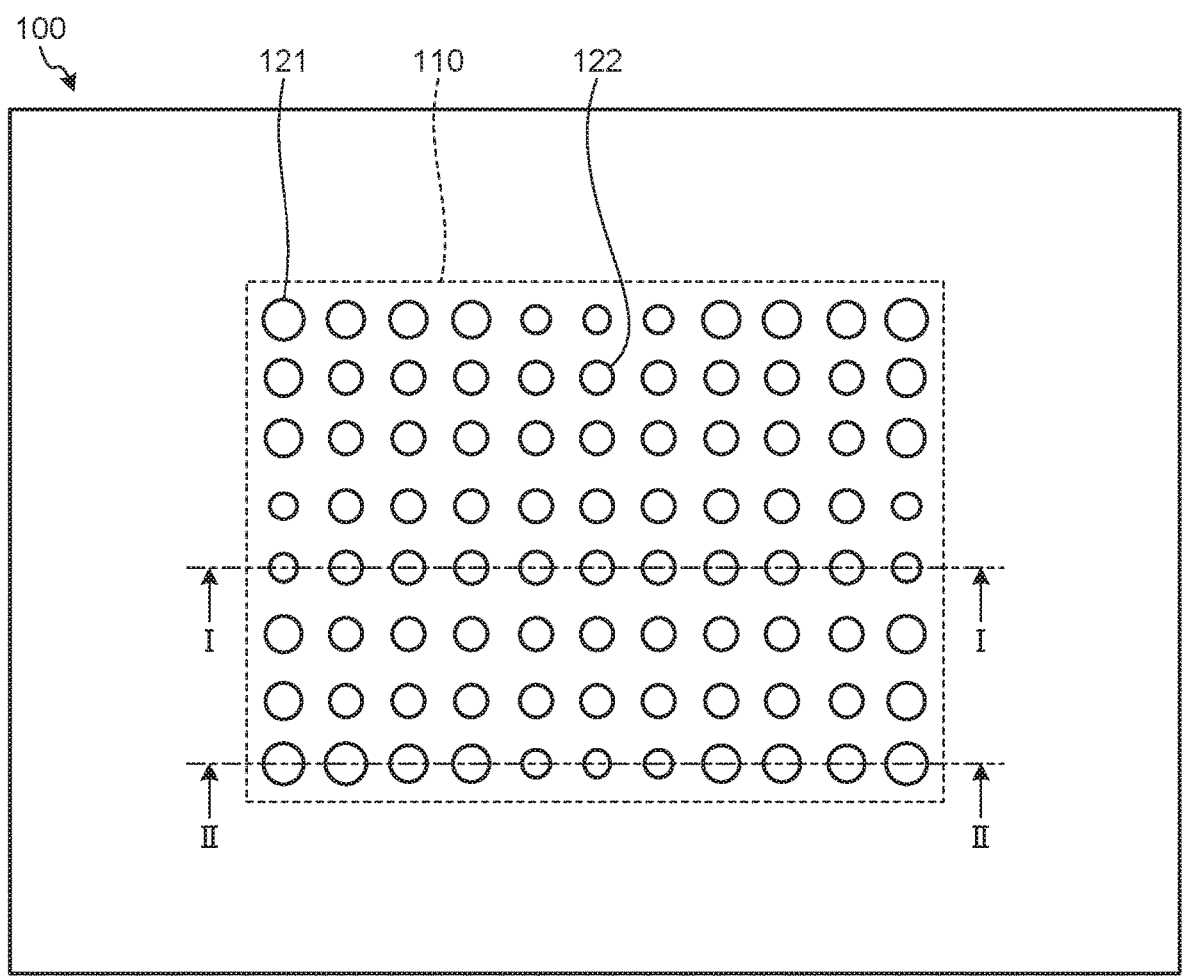
FIG. 1 is a plan view illustrating a structure of a main board according to one embodiment.

FIG. 1 is a plan view illustrating a structure of a main board 100 according to one embodiment. This main board 100 forms a stacked wiring substrate by joining another relay board, and the like layered thereon. Therefore, the main board 100 includes a junction area 110 in which the other relay board is attached. In the junction area 110, dummy posts 121 and connection posts 122 are formed.

The dummy posts 121 are conductive posts aligned along a periphery of the junction area 110. The dummy posts 121 are not connected to wirings of the main board 100, and are formed on, for example, a solder resist layer on a surface of the main board 100. The dummy posts 121 abut on peripheral portions of the relay board to support it when the main board 100 and the other relay board are joined.

The dummy posts 121 aligned along each side of the junction area 110 vary in height from the surface of the main board 100. Specifically, the dummy posts 121 arranged at both ends of a side are highest, and the dummy posts 121 gradually become lower as they approaches a center of a side. The dummy posts 121 thus having various heights are formed simultaneously, for example, by electrolytic copper plating. Because the dummy posts 121 having various heights are formed by electrolytic copper plating, the respective dummy posts 121 have different diameters also.

The connection posts 122 are conductive posts that are formed in an area surrounded by the dummy posts 121 of the junction area 110. The connection posts 122 are connected to wirings of the main board 100, and are soldered to an electrode pad of the relay board joined to the main board 100. That is, the connection posts 122 electrically connect the main board 100 and the relay board. The connection posts 122 have uniform heights from the surface of the main board 100, and have uniform diameters also. Moreover, the connection posts 122 are formed, for example, simultaneously with the dummy posts 121 by electrolytic copper plating. Although FIG. 1 illustrates the connection posts 122 aligned in a grid-like arrangement, the arrangement of the connection posts 122 is not limited thereto.

Figure 2:
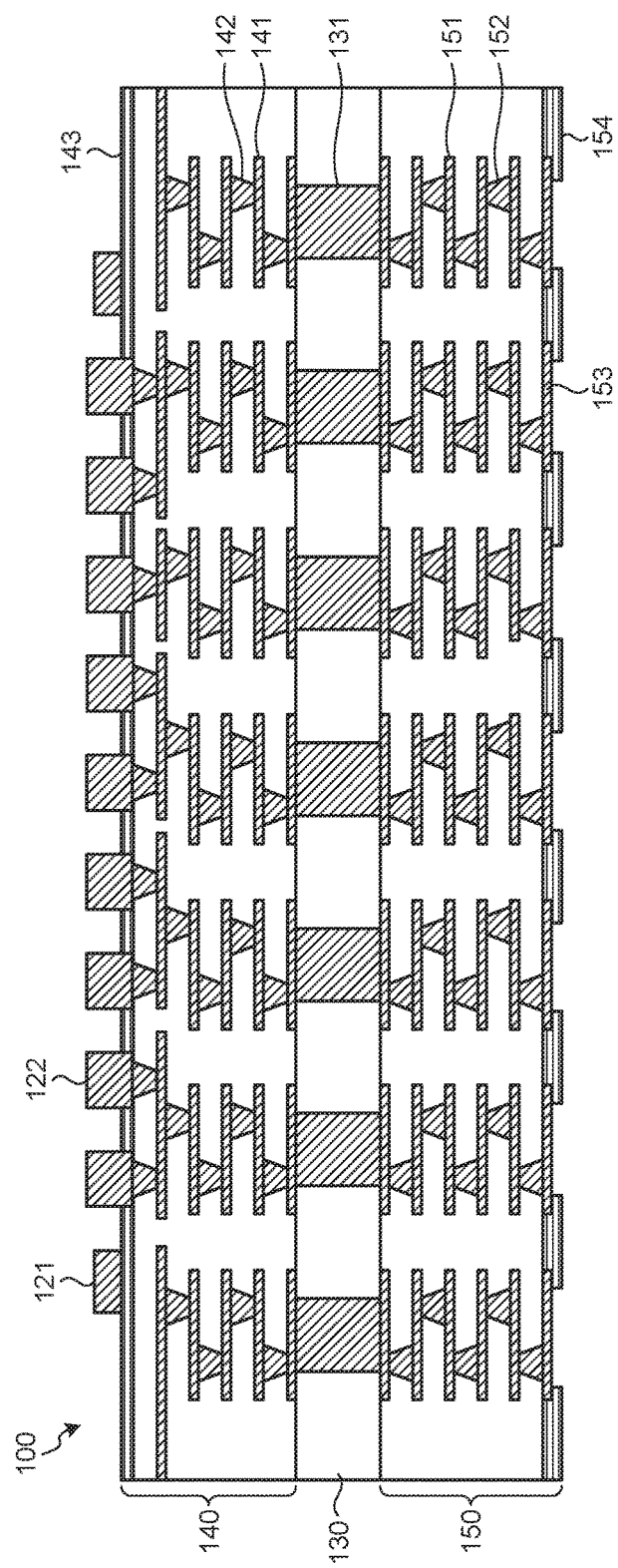
FIG. 2 is a schematic cross-section illustrating a structure of the main board according to one embodiment.

FIG. 2 is a schematic diagram illustrating a cross-section taken along a line I-I in FIG. 1. As illustrated in FIG. 2, the main board 100 is a multilayer board in which multiple layers are laminated. Specifically, the main board 100 includes a core layer 130 and buildup layers 140 and 150. The core layer 130 and the buildup layers 140, 150 compose a wiring structure of the main board.

The core layer 130 is a layer in which wiring layers are formed by plating on both sides of an insulating substrate. The wiring layers on both sides are connected to each other through vias 131 as necessary.

The buildup layer 140 is a layer that is formed on an upper surface of the core layer 130, and in which multiple layers, for example, including an insulating layer made from a buildup resin and a wiring layer 141 made from a conductive material are laminated. The respective wiring layers 141 are connected to one another through vias 142. Moreover, a surface of the buildup layer 140 is covered with a solder resist layer 143. At a position at which the via 142 is exposed to the surface of the buildup layer 140, an opening is formed in the solder resist layer 143, and a connection post 122 to be connected to the via 142 is formed. Furthermore, on both ends on which the connection posts 122 are aligned, the dummy posts 121 are formed on the solder resist layer 143. Because the dummy post 121 illustrated in FIG. 2 is the dummy post 121 arranged at a central portion of the side of the junction area 110, its height from the surface of the main board 100 is lower than the connection posts 122. Specifically, while the height of the connection posts 122 is, for example, about 20 micrometers (μm), the height of the dummy post 121 is, for example, about 10 μm.

The buildup layer 150 is a layer that is formed on a lower surface of the core layer 130, and in which multiple layers, for example, including an insulating layer made from a buildup resin and a wiring layer 151 made from a conductive material are laminated. The respective wiring layers 151 are connected to one another through vias 152. Moreover, on a surface of the buildup layer 150, an electrode pad 153 is formed with a conductive material, such as copper, to be a connecting terminal when the main board 100 is joined to an external part, such as a mother board. The surface of the buildup layer 150 is covered with a solder resist layer 154 that exposes the electrode pad 153.

Figure 3:
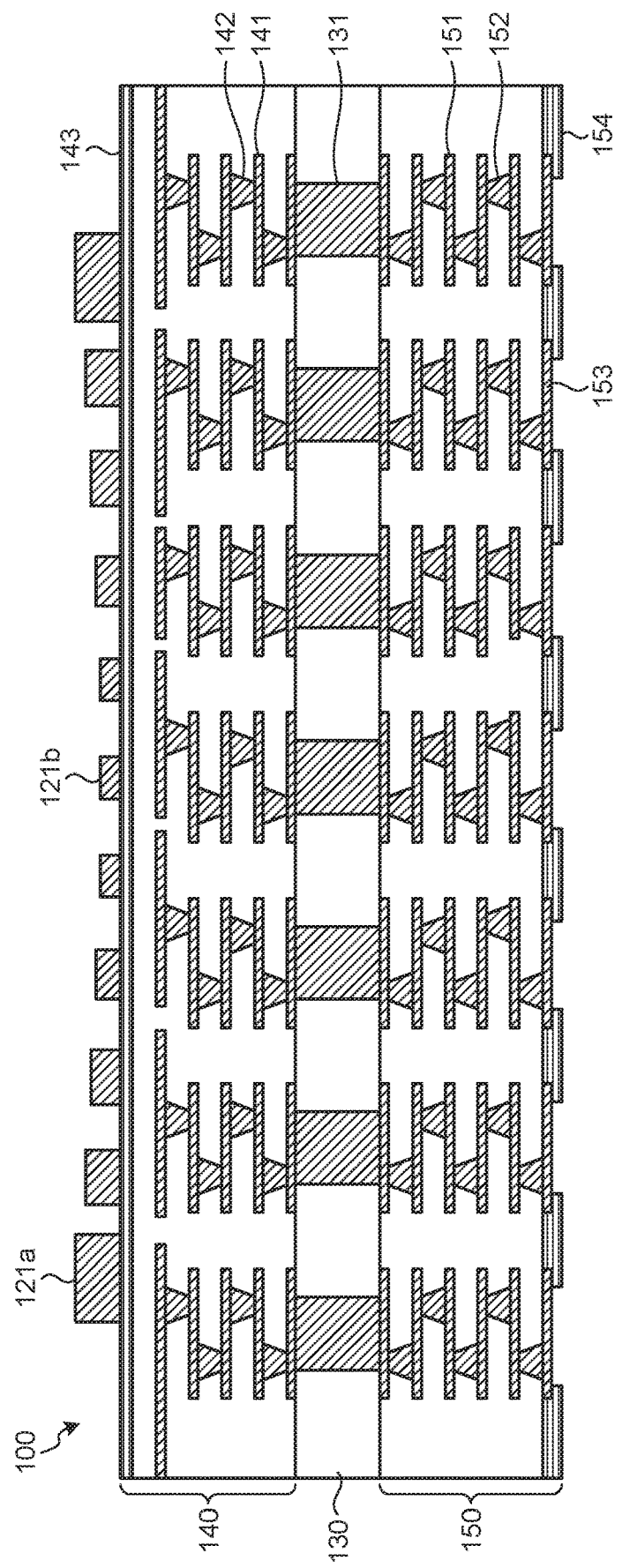
FIG. 3 is another schematic cross-section illustrating a structure of the main board according to one embodiment.

FIG. 3 is a schematic diagram illustrating a cross-section taken along a line II-II in FIG. 1. That is, FIG. 3 illustrates a cross-section of a periphery of the junction area 110 in which the dummy posts 121 are arranged.

As illustrated in FIG. 3, plural pieces of the dummy posts 121 are formed on the solder resist layer 143. Furthermore, dummy posts 121a that are arranged on both ends of a side of the junction area 110 are higher than dummy posts 121b that are arranged in a central portion of the side. That is, the heights of the dummy posts 121 from the surface of the main board 100 vary, and the heights of the dummy posts 121 gradually become lower from the both ends of the side of the junction area 110 toward the center of the side. Specifically, while the height of the dummy post 121a at both ends of the side is, for example, about 25 μm and is higher than the connection posts 122, the height of the dummy posts 121b at a central portion of the side is, for example, about 10 μm and is lower than the connection posts 122. Moreover, because these dummy posts 121 are formed simultaneously by, for example, electrolytic copper plating, diameters thereof also vary. That is, as a result of performing electrolytic copper plating on different sizes of diameters, heights in which the plating grows vary, and the dummy posts 121 having different heights are formed by electrolytic copper plating for the same period of time.

Figure 4:
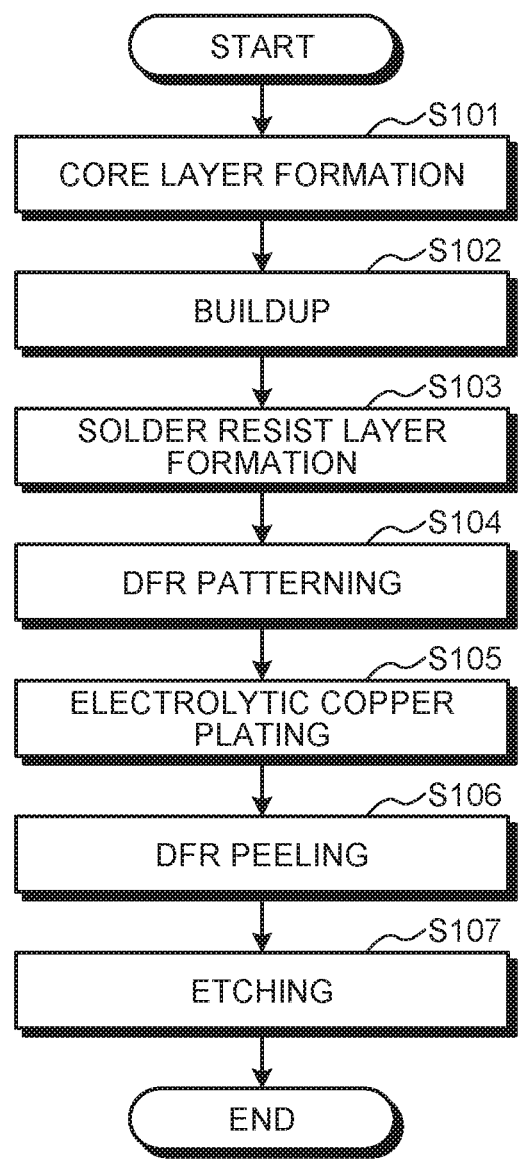
FIG. 4 is a flowchart illustrating a manufacturing method of the main board according to one embodiment.

Subsequently, a manufacturing method of the main board 100 structured as described above will be described, referring to a flowchart in FIG. 4.

First, the core layer 130 to be a supporting member of the main board 100 is formed (step S101). Specifically, in an insulating substrate, the vias 131 that pierces through the substrate are formed, and wiring layers of a metal, such as copper, are formed on both sides of the substrate. The wiring layers on both sides of the substrate are connected with each other through the vias 131.

The buildup layers 140, 150 are then formed on the upper surface and the lower surface of the core layer 130 by buildup method (step S102). Specifically, on the upper surface of the core layer 130, layers including an insulating layer and the wiring layer 141 are laminated to form the buildup layer 140. The wiring layers 141 are connected to one another through the vias 142 piercing through the insulating layer. Moreover, on the lower surface of the core layer 130, layers including an insulating layer and the wiring layers 151 are laminated to form the buildup layer 150. The wiring layers 151 are connected through vias 152 piercing through the insulating layer. Furthermore, on the surface of the buildup layer 150, the electrode pad 153 is formed. The insulating layer is formed by using, for example, epoxy resin, polyimide resin, or the like. Moreover, the wiring layers 141, 151, the vias 142, 152, and the electrode pad 153 are formed by plating of a metal, such as copper.

On the surfaces of the buildup layers 140, 150, the solder resist layers 143, 154 are formed (step S103). That is, the surface of the buildup layer 140 is covered with the solder resist layer 143, and the surface of the buildup layer 150 is covered with the solder resist layer 154. At a position corresponding to the via 142 on the uppermost layer of the buildup layer 140, an opening is arranged piercing through the solder resist layer 143. That is, the upper layer of the via 142 is exposed from the opening of the solder resist layer 143. On the other hand, at a position corresponding to the electrode pad 153 of the buildup layer 150, an opening is arranged piercing through the solder resist layer 154. That is, the electrode pad 153 is exposed from the opening of the solder resist layer 154.

Subsequently, in the junction area 110 on the surface of the buildup layer 140, the dummy posts 121 and the connection posts 122 are formed. Specifically, on the surface of the buildup layer 140, a seed layer is formed by, for example, electrolytic copper plating or spattering, and a DFR is affixed on the seed layer. Furthermore, by patterning of the DFR, openings are formed at positions at which the dummy posts 121 and the connection posts 122 are formed (step S104).

Figure 5:
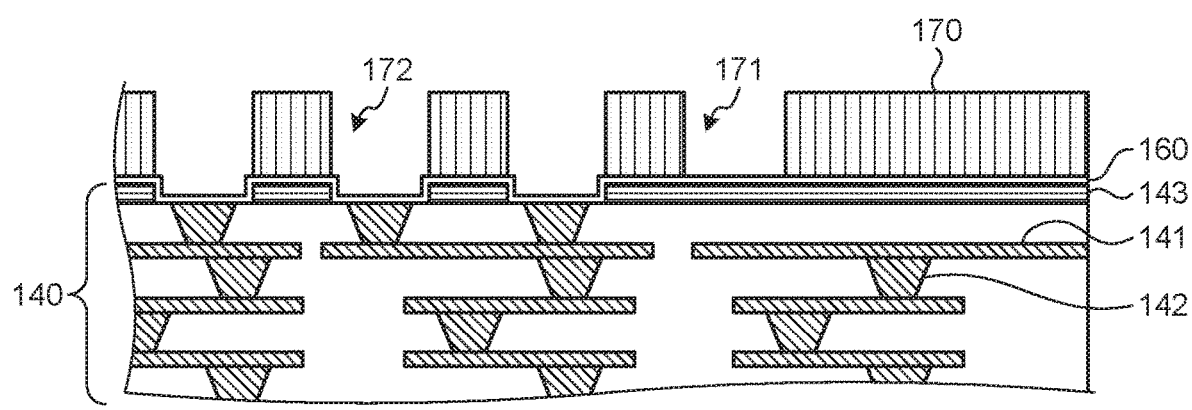
FIG. 5 illustrates a specific example of a dry film resist (DFR) patterning process.

That is, as illustrated in FIG. 5, for example, a DFR 170 is affixed on a seed layer 160, and an opening 171 is formed at a position at which the dummy post 121 is formed, and an opening 172 is formed at a position at which the connection post 122 is formed. The position at which the dummy post 121 is formed is at a periphery of the junction area 110 in which the relay board is joined, and the position at which the connection post 122 is formed is a position at which the upper surface of the via 142 on the upper most layer of the buildup layer 140 is exposed. Therefore, the opening 171 is formed at a periphery, piercing through the junction area 110, and the opening 172 is formed at a position corresponding to the via 142, piercing therethrough. Moreover, because the dummy post 121 and the connection post 122 can differ in height, diameters of the openings 171, 172 also differ in size according to the respective heights.

Figure 6:
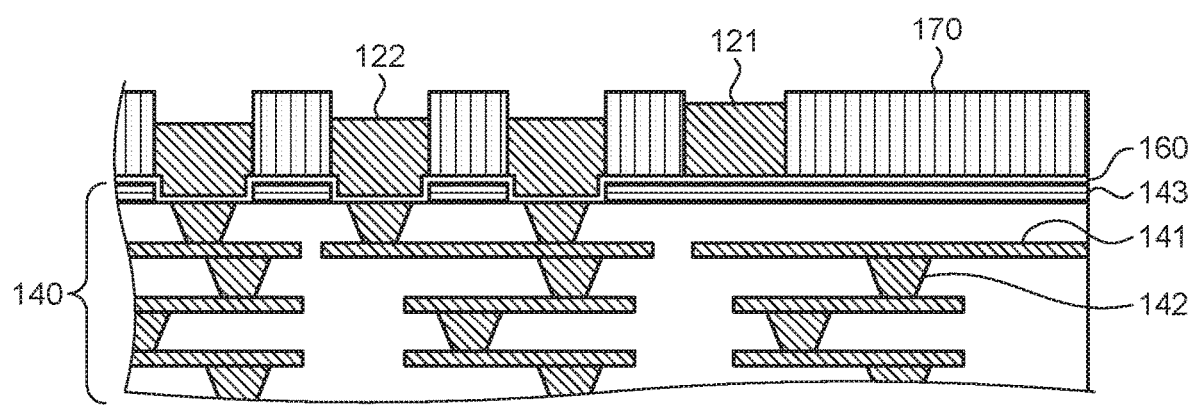
FIG. 6 illustrates a specific example of an electrolytic copper plating process.

Having performed patterning of the DFR 170, the dummy posts 121 and the connection posts 122 are formed by electrolytic copper plating (step S105). Specifically, for example, as illustrated in FIG. 6, electrolytic copper is deposited according to the size of diameters of the openings 171, 172 of the DFR 170, to form the dummy post 121 in the opening 171, and to form the connection post 122 in the opening 172. Because the growth of plating can be thus adjusted according to the size of diameter of the opening of the DFR 170, the size of the diameter of the opening 171 is appropriately set, and the dummy posts 121 that are high at both ends of then sides of the junction area 110 and low in the central portion are formed. The dummy posts 121 are formed on the solder resist layer 143, and are not connected to the wiring layers 141 of the buildup layer 140, while the connection posts 122 are formed on the vias 142, and are electrically connected to the wiring layers 141 of the buildup layer 140.

Figure 7:
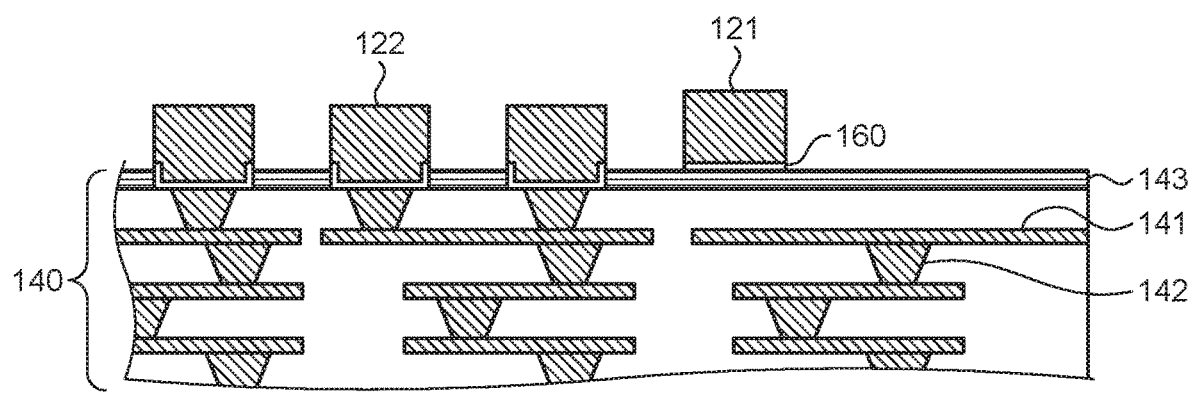
FIG. 7 illustrates a portion near a surface of the main board in an enlarged manner.

The DFR 170 is peeled off (step S106), and etching of the seed layer 160 is performed (step S107). Thus, the seed layer 160 other than a portion in which the dummy posts 121 and the connection posts 122 are formed is removed, and as illustrated in FIG. 7, for example, the seed layer 160 only remains at bases of the dummy posts 121 and the connection posts 122. As described, the dummy posts 121 are formed at the periphery of the junction area 110, and the connection posts 122 are formed in an area surrounded by the dummy posts 121.

Figure 8:
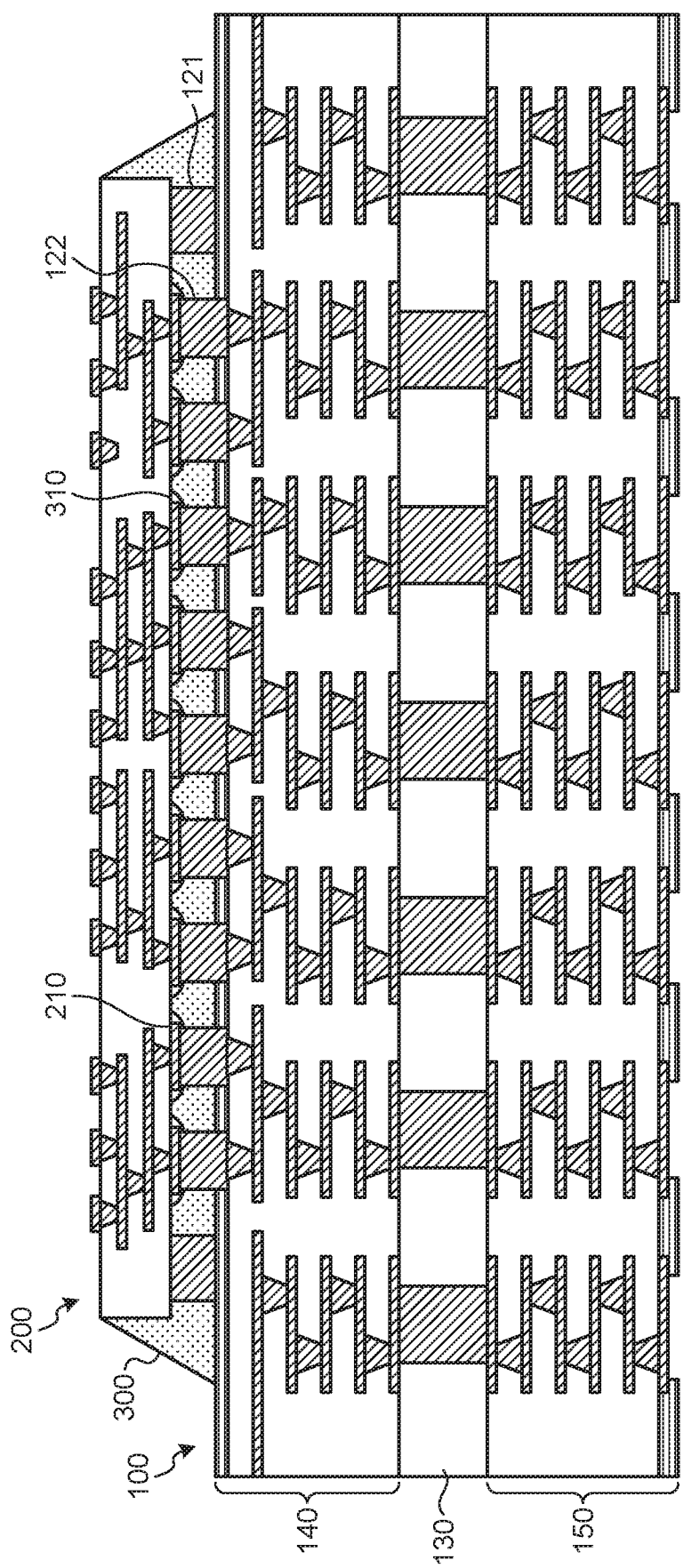
FIG. 8 illustrates an example of a structure of a stacked wiring substrate according to one embodiment.

The main board 100 thus manufactured forms a stacked wiring substrate by being joined with another relay board. FIG. 8 illustrates an example of a structure of the stacked wiring substrate. The stacked wiring substrate illustrated in FIG. 8 has a structure in which the main board 100 and a relay board 200 are joined.

Specifically, the relay board 200 is attached to the junction area 110 of the main board 100 by an underfill material 300. Moreover, on a lower surface of the relay board 200, an electrode pad 210 is formed, and the electrode pad 210 is connected to the connection posts 122 of the main board 100 by solder 310.

When joining the relay board 200, the underfill material 300 is arranged in the junction area 110 of the main board 100, and the relay board 200 is placed from above to sandwich the underfill material 300. The main board and the relay board 200 are pressurized in a direction in which the both wiring substrates come close to each other. At this time, the underfill material 300 sandwiched between the main board 100 and the relay board 200 is drained out to the circumference of the relay board 200, to form a fillet. In the present embodiment, because the dummy posts 121 are formed at the periphery of the junction area 110, the peripheral portions of the junction area 110 are supported by the dummy posts 121, and a gap between the main board 100 and the relay board 200 from which the underfill material 300 is drained is prescribed.

Figure 9:
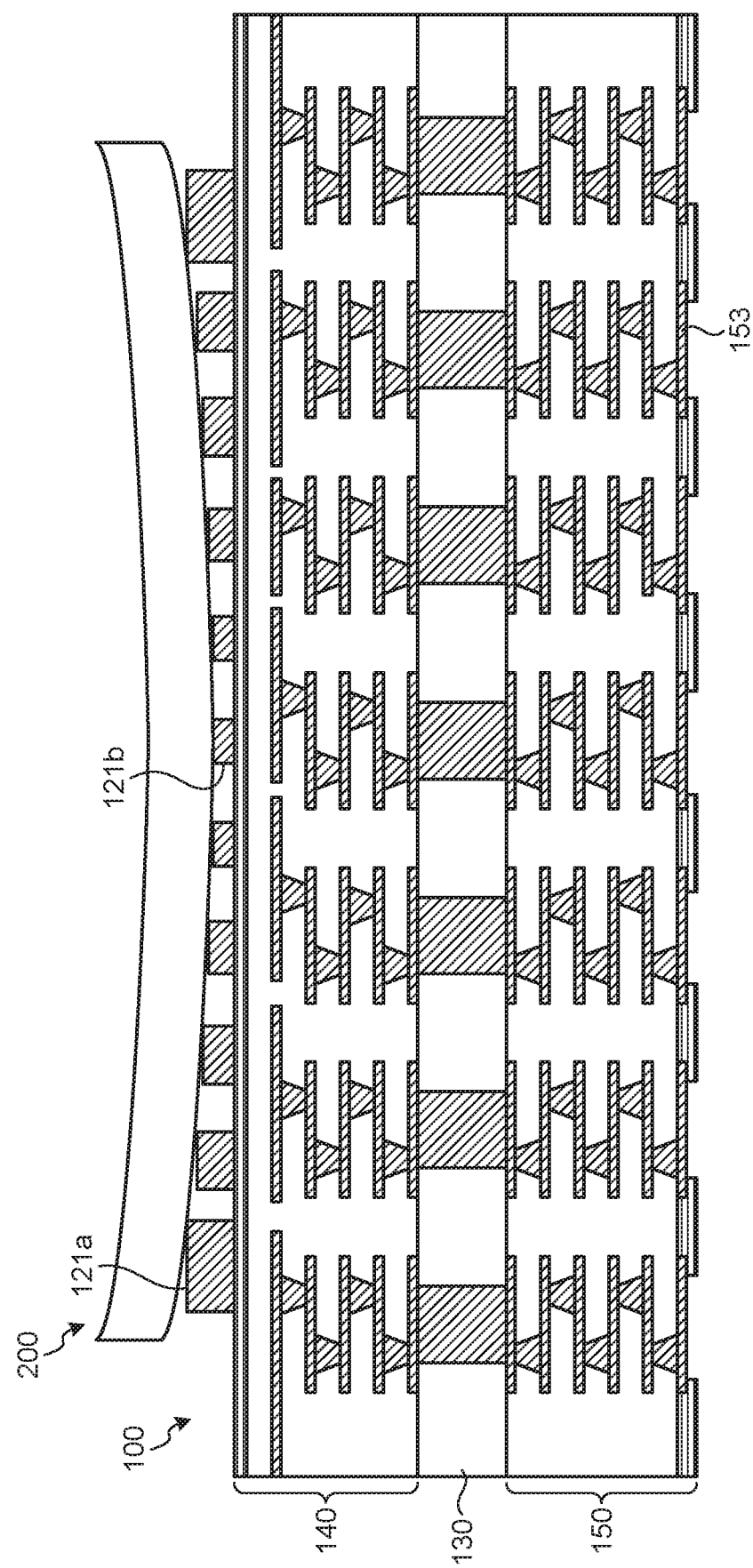
FIG. 9 is a diagram for explaining a distance between wiring substrates.

Specifically, for example, as illustrated in FIG. 9, because the heights of the dummy posts 121 decrease as they come closer to the center from both sides of the side of the junction area 110, distances between the main board 100 and the relay board 200 are different depending on a position in the peripheral portion of the relay board 200. That is, while a distance between the main board 100 and the relay board 200 is large at a portion at the four corners of the relay board 200, a distance between the main board 100 and the relay board 200 is small at a central portion of the side of the relay board 200. Consequently, a relatively large amount of the underfill material 300 is drained from around the four corners of the relay board 200 at which the distance between the main board 100 and the relay board 200 is large. On the other hand, drain of the underfill material 300 is inhibited by the peripheral portions of the relay board 200 in the central portion of the sides of the relay board 200 at which the distance between the main board 100 and the relay board 200 is small, and an amount of the underfill material 300 drained therefrom is relatively small.

Figure 10:
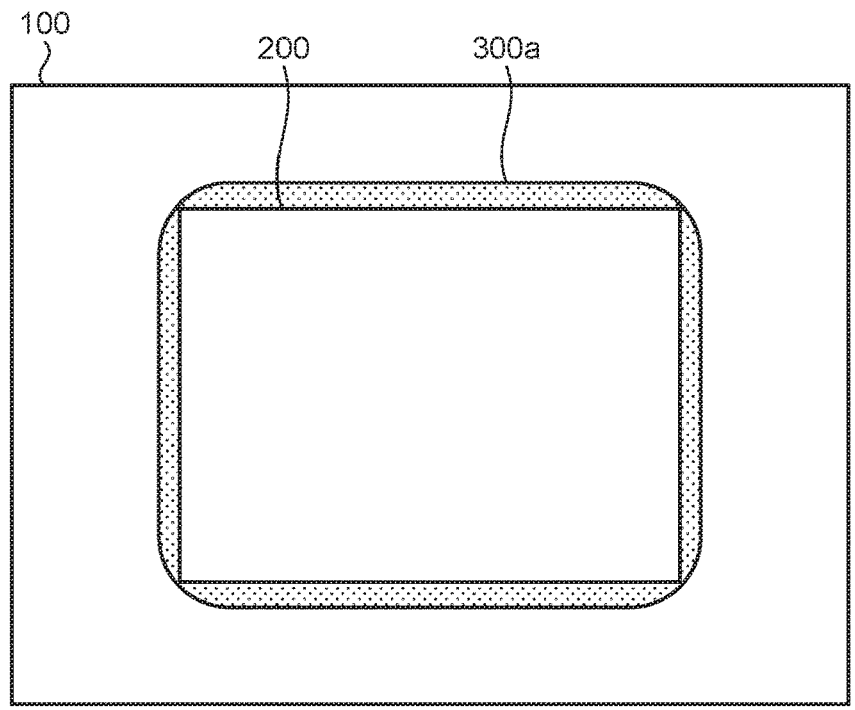
FIG. 10 illustrates a specific example of a shape of a fillet.
Figure 11:
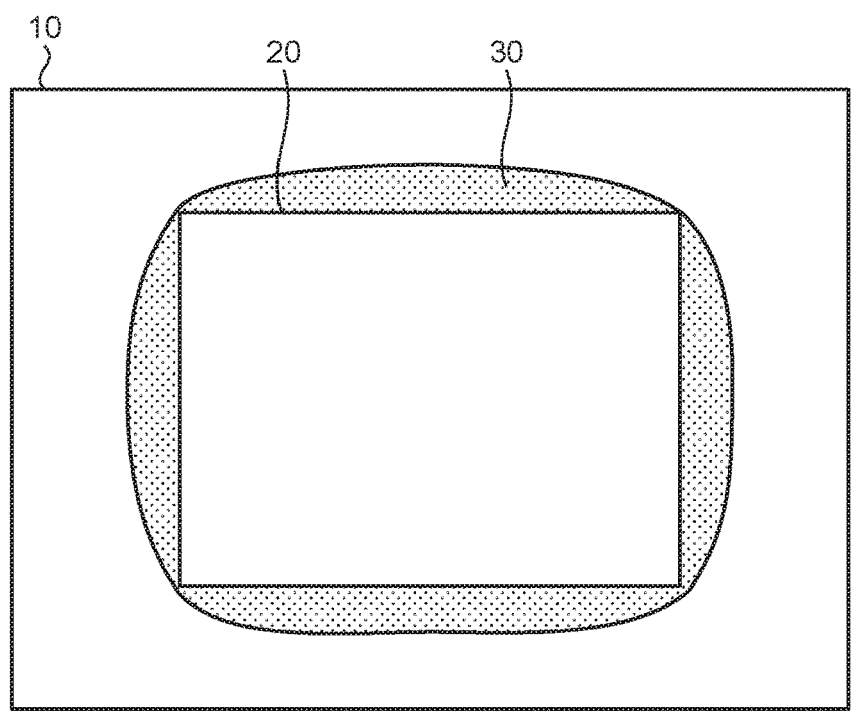
FIG. 11 illustrates an example a stacked wiring substrate.

As described, by adjusting an amount of the underfill material 300 to be drained by varying the heights of the dummy posts 121, a fillet 300a that spreads into a uniform size, for example, as illustrated in FIG. 10 can be formed around the relay board 200. That is, because the heights of the dummy posts 121 vary according a position on the side of the relay board 200, a drain amount of the underfill material 300 can be adjusted according to the height of each of the dummy post 121, and the shape of the fillet 300a can be controlled.

Particularly, because the amount of the underfill material 300 that flows out from a central portion of the side of the relay board 200 to a periphery is limited, the fillet 300a is controlled not to spread largely at a central portion of the side. Therefore, the fillet 300a around the relay board 200 can be formed in a uniform size, and parts can be mounted on the main board 100 near the relay board 200, aligning positions thereof. Furthermore, because the peripheral portions of the relay board 200 are supported by the dummy posts 121, a distance between the main board 100 and the relay board 200 is not to be excessively small, and the underfill material 300 can be drained to the periphery of the relay board 200 without fail. As a result, the excessive underfill material 300 sandwiched between the main board 100 and the relay board 200 can be drained out to the periphery, and the connection posts 122 of the main board 100 and the electrode pad 210 of the relay board 200 can be brought into contact securely.

As described above, according to the present embodiment, dummy posts are formed along a periphery of a junction area of a main board in which a relay board is joined, such that heights of the dummy posts gradually decrease from both ends of a side of the junction area toward a central portion. Therefore, a distance between the main board and the peripheral portion of the relay board is smaller at a central portion than at both ends of the side, and an amount of an underfill material that flows out to the periphery of the relay board from the central portion of the side is limited. As a result, the amount of the underfill material that flows out from respective positions of the side of the relay board can be controlled to be uniform, and a shape of a fillet can be adjusted.

In the embodiment described above, heights and diameters of the dummy posts 121 vary according to a position in the periphery of the junction area 110 but, furthermore, the density of the dummy posts 121 to be arranged may vary according to a position also. Specifically, for example, the dummy posts 121 may be arranged sparsely at both ends of the side of the junction area 110, and the dummy posts 121 are arranged densely at a central portion of the side. Thus, a width of a path through which the underfill material 300 is drained can be adjusted by the dummy posts 121, and the shape of the fillet 300a can be controlled.

Figure 12:
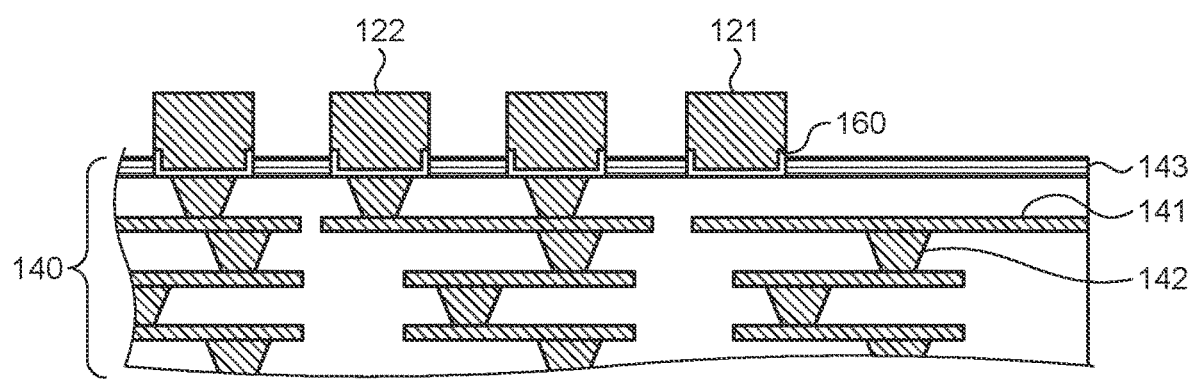
FIG. 12 is a diagram for a portion near a surface of the main board.

Moreover, in the embodiment described above, the dummy posts 121 are formed on the solder resist layer 143, but the dummy posts 121 may be formed directly on the insulating layer forming the buildup layer 140, as illustrated in FIG. 12. In this case, an opening should be formed piercing therethrough also at a position at which the dummy post 121 is formed concurrently with formation of the opening at the position at which the connection post 122 of the solder resist layer 143 is formed by piercing therethrough. When the opening is formed in the solder resist layer 143 at the position at which the dummy post 121 is formed, the insulating layer of the buildup layer 140 is exposed at a bottom of this opening.

According to one aspect of the wiring substrate, the stacked wiring substrate, and the manufacturing method of a wiring substrate disclosed in the present application, an effect that a shape of a fillet can be adjusted is produced.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
   a wiring structure that includes a wiring layer and an insulating layer laminated;
   a solder resist layer that covers a surface of the wiring structure;
   a plurality of first posts, each of the plurality of first posts including:
      a first seed layer that is formed on the solder resist layer or the insulating layer and not electrically connected to the wiring layer; and
      a first metal layer that is formed on the first seed layer; and
   a second post that includes:
      a second seed layer that is connected to the wiring layer at a position surrounded by the plurality of first posts; and
      a second metal layer that is formed on the second seed layer and is made from same metal material as the first metal layer,
   wherein
   the plurality of first posts are formed along a periphery of a predetermined area on the wiring structure such that a post among the plurality of first posts arranged at a central portion of a side constituting the periphery of the predetermined area is lower in height from the surface of the wiring structure than posts among the plurality of first posts arranged at both ends of the side.

2. The wiring substrate according to claim 1, wherein the plurality of first posts are formed on the insulating layer exposed to the surface of the wiring structure.

3. The wiring substrate according to claim 1, wherein the plurality of first posts are formed such that the posts among the plurality of first posts arranged at both ends of the side constituting the periphery of the predetermined area are higher in height from the surface of the wiring structure than the second post, and posts among the plurality of first posts arranged at the central portion of the side are lower in height from the surface of the wiring structure than the second post.

4. The wiring substrate according to claim 1, wherein the plurality of first posts vary in size of diameter according to height from the surface of the wiring structure.

5. The wiring substrate according to claim 1, wherein the plurality of first posts are arranged in different densities along the side constituting the periphery of the predetermined area.

6. A stacked wiring substrate in which a first wiring board and a second wiring board are joined, and an underfill material is filled in an area between the first wiring board and the second wiring board, wherein
   the first wiring board includes:
      a wiring structure that includes a wiring layer and an insulating layer laminated;
      a solder resist layer that covers a surface of the wiring structure;
      a plurality of first posts, each of the plurality of first posts including:
         a first seed layer that is formed on the solder resist layer or the insulating layer and not electrically connecting the first posts to the wiring layer; and
         a first metal layer that is formed on the first seed layer; and
      a second post that includes:
         a second seed layer that is connected to the wiring layer at a position surrounded by the plurality of first posts; and
         a second metal layer that is formed on the second seed layer and is made from same metal material as the first metal layer,
   wherein
   the plurality of first posts are formed along a periphery of a predetermined area on the wiring structure such that a post among the plurality of first posts arranged at a central portion of a side constituting the periphery of the junction area is lower in height from the surface of the wiring structure than posts among the plurality of first posts arranged at both ends of the side, and
   the second wiring board is electrically connected to the second post.

7. The stacked wiring substrate according to claim 6, wherein
   the plurality of first posts supports the second wiring board with the posts among the plurality of first posts arranged at both ends of the side constituting the periphery of the junction area.

8. A manufacturing method of a wiring substrate comprising:

forming a wiring structure by laminating a wiring layer and an insulating layer;

forming a solder resist layer that covers a surface of the wiring structure and has an opening from which a portion of the wiring layer is exposed;

forming a seed layer on the solder resist layer and the portion of the wiring layer exposed from the opening;

forming a plurality of first posts and a second post by metal plating on the seed layer, each of the first posts formed at a first position of the seed layer located on the solder resist or the insulating layer and not electrically connected to the wiring layer, and the second post formed at a second position surrounded by the first posts, wherein the forming the first posts and the second post includes forming the first posts along a periphery of a predetermined area on the wiring structure such that a post among the plurality of first posts arranged at a central portion of a side constituting the periphery of the predetermine area is lower in height from the surface of the wiring structure than posts among the plurality of first posts arranged at both ends of the side.

* * * * *